(12) United States Patent
Schmit et al.

(10) Patent No.: US 11,191,187 B2
(45) Date of Patent: Nov. 30, 2021

(54) ELECTRONIC ASSEMBLY WITH PHASE-CHANGE MATERIAL FOR THERMAL PERFORMANCE

(71) Applicant: Deere & Company, Moline, IL (US)

(72) Inventors: Christopher J. Schmit, Fargo, ND (US); Andrew Schefter, Fargo, ND (US); William F. Cooper, Fargo, ND (US)

(73) Assignee: Deere & Company, Moline, IL (US)

( * ) Notice: Subject to any disclaimer, the term of this patent is extended or adjusted under 35 U.S.C. 154(b) by 0 days.

(21) Appl. No.: 16/653,333

(22) Filed: Oct. 15, 2019

(65) Prior Publication Data

US 2020/0352054 A1 Nov. 5, 2020

Related U.S. Application Data

(60) Provisional application No. 62/840,923, filed on Apr. 30, 2019.

(51) Int. Cl.
*H05K 7/20* (2006.01)
*H05K 1/18* (2006.01)
(Continued)

(52) U.S. Cl.
CPC ..... *H05K 7/20309* (2013.01); *H01L 23/3672* (2013.01); *H01L 23/427* (2013.01);
(Continued)

(58) Field of Classification Search
CPC . H01L 23/427; H01L 21/4871; F28D 15/046; F28D 15/0266; F28D 15/0275; F28D 15/04; F28D 2021/0028; F28D 2021/0029; F28D 15/00; F28D 15/02; H05K 7/20336; H05K 7/20318; H05K 7/20309; H05K 7/209; H05K 7/2029; H05K 7/20663; H05K 7/20254; H05K 1/0203; H05K 2201/064; H05K 7/20763;
(Continued)

(56) References Cited

U.S. PATENT DOCUMENTS 3,682,239 A * 8/1972 Abu-Romia ............ F28D 15/04
165/104.26
3,786,861 A * 1/1974 Eggers .................. F28D 15/046
165/104.26
(Continued)

OTHER PUBLICATIONS

European Search Report issued in counterpart application No. 20172535.5 dated Sep. 23, 2020 (11 pages).

*Primary Examiner* — Stephen S Sul
*Assistant Examiner* — Michael A Matey

(57) ABSTRACT

An electronic assembly with phase-change material for thermal performance comprises a substrate and a semiconductor device mounted on the substrate. A sealed first thermal channel comprises a first evaporator section, a first fluid transport section, and a first condenser section. A phase-change material is contained in the sealed first thermal channel. The first evaporator section overlies the semiconductor device. The first fluid transport section extends between the first evaporator section and the first condenser section. The first evaporator section is spaced apart from the first condenser section. The first condenser section is in thermal communication with the heat sink.

20 Claims, 6 Drawing Sheets

(51) Int. Cl.
  *H05K 1/02* (2006.01)
  *H01L 23/427* (2006.01)
  *H01L 23/367* (2006.01)

(52) U.S. Cl.
  CPC ........... *H05K 1/0203* (2013.01); *H05K 1/181* (2013.01); *H05K 7/2039* (2013.01); *H05K 7/20318* (2013.01); *H05K 7/20327* (2013.01); *H05K 7/20936* (2013.01); *H05K 2201/064* (2013.01); *H05K 2201/10166* (2013.01)

(58) Field of Classification Search
  CPC .. H05K 7/20936; H05K 7/2039; H05K 7/208; H05K 7/20627; H05K 7/20881; G06F 2200/201; G06F 1/20
  See application file for complete search history.

(56) References Cited

U.S. PATENT DOCUMENTS

| | | | | |
|---|---|---|---|---|
| 5,982,616 | A * | 11/1999 | Moore | G06F 1/20 165/104.33 |
| 6,041,850 | A * | 3/2000 | Esser | H05K 7/20936 165/104.33 |
| 6,517,221 | B1 * | 2/2003 | Xie | F28D 15/0266 257/714 |
| 8,069,909 | B2 * | 12/2011 | Qin | H01L 23/427 165/104.33 |
| 2006/0065386 | A1 * | 3/2006 | Alam | G06F 1/20 165/104.33 |
| 2006/0272798 | A1 * | 12/2006 | Liu | H01L 23/427 165/104.33 |
| 2007/0012427 | A1 * | 1/2007 | Liu | H01L 23/427 165/104.26 |
| 2007/0029071 | A1 * | 2/2007 | Hwang | H01L 23/427 165/104.33 |
| 2007/0258218 | A1 * | 11/2007 | Peng | H01L 23/427 361/715 |
| 2008/0105405 | A1 * | 5/2008 | Hsu | F28D 15/046 165/104.26 |
| 2009/0046428 | A1 * | 2/2009 | Hung | H01L 23/427 361/697 |
| 2010/0124012 | A1 * | 5/2010 | Kondo | H05K 7/20818 361/679.47 |
| 2011/0075360 | A1 * | 3/2011 | Tomioka | H05K 7/20336 361/695 |
| 2011/0179806 | A1 * | 7/2011 | Ipposhi | F28D 15/0266 62/3.3 |
| 2012/0075805 | A1 * | 3/2012 | Cheng | H01L 23/427 361/700 |
| 2013/0042636 | A1 * | 2/2013 | Shabany | F28D 15/0266 62/79 |
| 2013/0155622 | A1 * | 6/2013 | Chang | H05K 7/20809 361/720 |
| 2013/0168058 | A1 * | 7/2013 | Chamseddine | G06F 1/203 165/104.26 |
| 2013/0170142 | A1 | 7/2013 | Weaver, Jr. et al. | |
| 2013/0299136 | A1 * | 11/2013 | Bilski | F28D 15/046 165/104.26 |
| 2014/0160679 | A1 * | 6/2014 | Kelty | H05K 7/20672 361/700 |
| 2014/0268550 | A1 * | 9/2014 | Kinstle | H05K 7/20436 361/679.48 |
| 2015/0043148 | A1 * | 2/2015 | Zhang | H05K 7/20727 361/679.32 |
| 2015/0159924 | A1 * | 6/2015 | Calderon | F25D 11/006 62/3.6 |
| 2015/0354902 | A1 * | 12/2015 | McDonald | F28D 15/0275 165/45 |
| 2016/0018139 | A1 * | 1/2016 | Olsson | F25B 21/02 62/3.3 |
| 2016/0037684 | A1 | 2/2016 | Kim et al. | |
| 2016/0128234 | A1 * | 5/2016 | Uesugi | H01L 23/427 361/700 |
| 2016/0209121 | A1 * | 7/2016 | Yeh | F28D 15/0233 |
| 2017/0303441 | A1 * | 10/2017 | Farshchian | H05K 7/20309 |
| 2018/0128552 | A1 * | 5/2018 | Ito | H05K 7/20409 |
| 2020/0173729 | A1 * | 6/2020 | Jaccard | F28D 15/0275 |

* cited by examiner

ELECTRONIC ASSEMBLY WITH PHASE-CHANGE MATERIAL FOR THERMAL PERFORMANCE

RELATED APPLICATION

This application claims the benefit of the filing date of and priority to U.S. Provisional Application Ser. No. 62/840,923, filed Apr. 30, 2019, which is incorporated herein by reference in its entirety.

FIELD

This disclosure relates to an electronic assembly with a phase change material for thermal performance.

BACKGROUND

In certain prior art, semiconductor devices, such as microprocessors, integrated circuits, insulated-gate, bipolar transistors (IGBT) and metal-oxide-semiconductor field-effect transistors (CMOS), and silicon-carbide (SiC) transistors, have thermal constraints that can limit performance. For vehicle applications, such as off-road vehicles or heavy equipment, the semiconductor devices may be incorporated into data processing systems, power electronic modules, like inverters or converters with heavy duty cycles and/or transient loads that demand high thermal dissipation. Some data processing systems may be used for computationally demanding applications such as artificial intelligence and machine vision processing. Thus, there is a need to make the electronic modules compact consistent with targeted power density.

SUMMARY

In accordance with one embodiment, an electronic assembly with phase-change material for thermal performance comprises a substrate and a semiconductor device mounted on the substrate. A sealed first thermal channel comprises a first evaporator section, a first fluid transport section, and a first condenser section. A phase-change material is contained in the sealed first thermal channel. The first evaporator section overlies the semiconductor device. The first fluid transport section extends between the first evaporator section and the first condenser section. The first evaporator section is spaced apart from the first condenser section. The first condenser section is in thermal communication with the heat sink.

DETAILED DESCRIPTION

Figure 1:
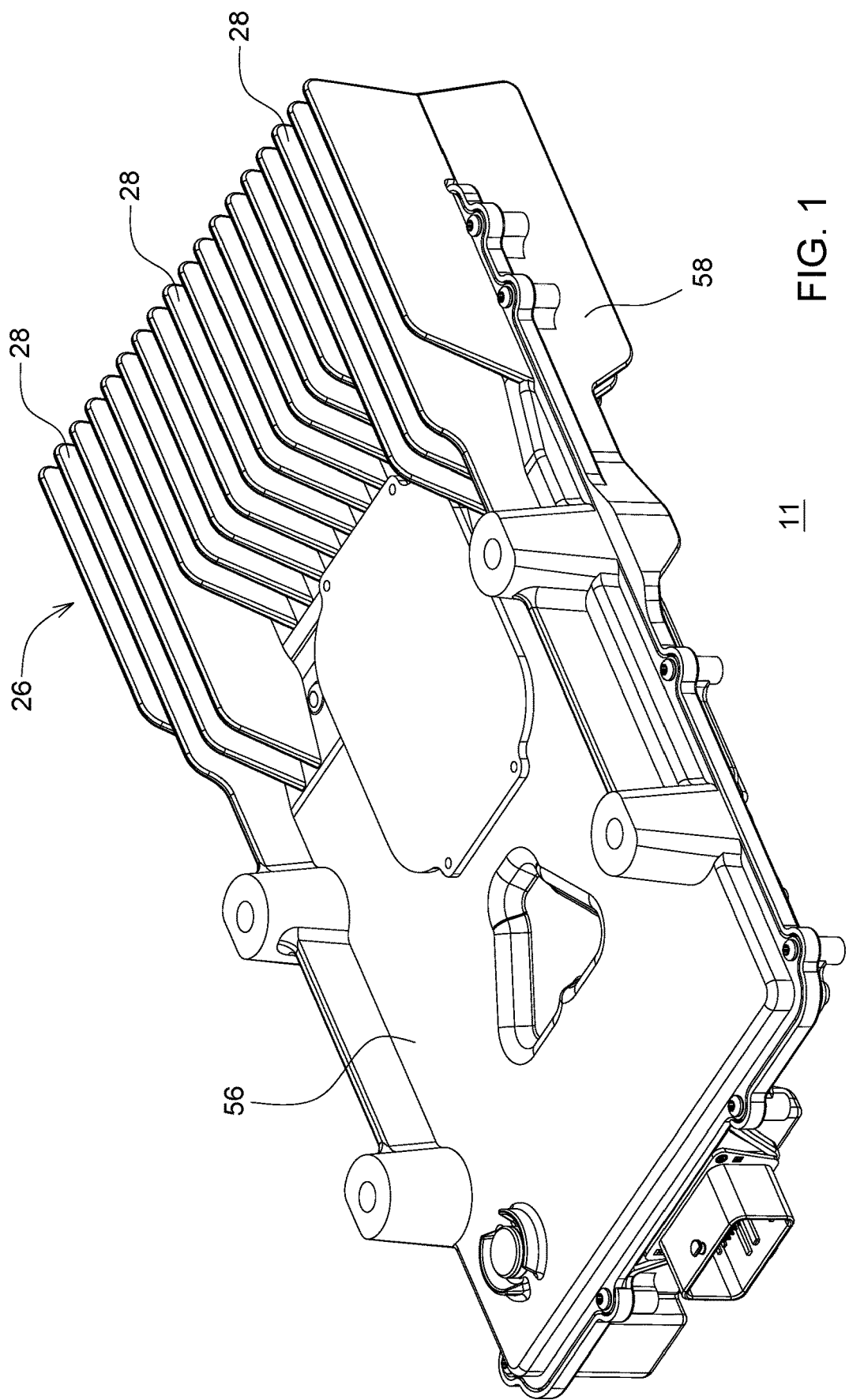
FIG. 1 is a top perspective view of one embodiment of the electronic enclosure in accordance with this disclosure.
Figure 2:
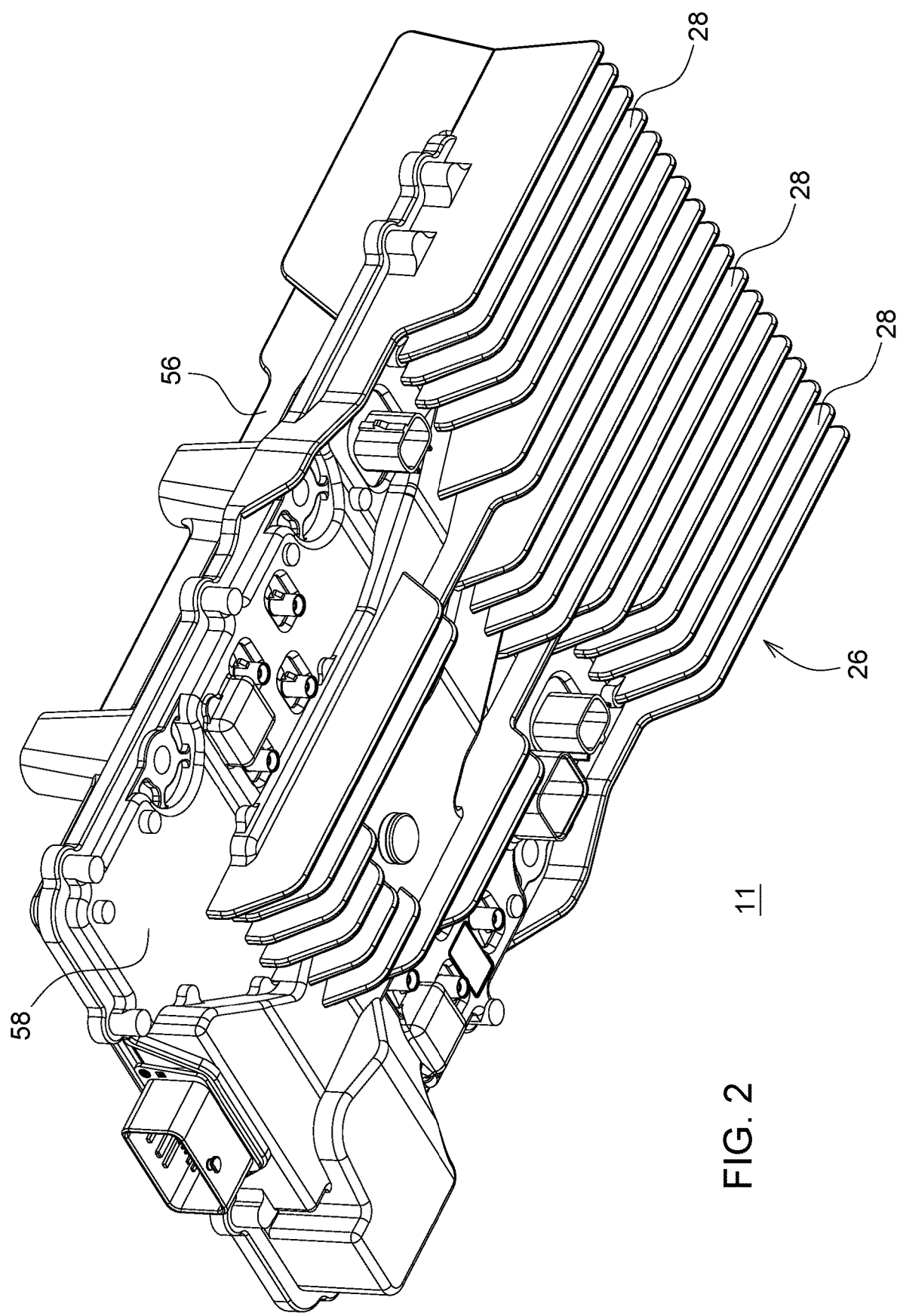
FIG. 2 is a bottom perspective view of the electronic enclosure of FIG. 1.

In accordance with one embodiment, an electronic assembly 11 with phase-change material 12 for thermal performance comprises a substrate 14 and a semiconductor device 16 mounted on the substrate 14. In one configuration, the substrate 14 comprises a circuit board having a dielectric layer and metallic conductive traces on the dielectric layer. The dielectric layer may comprise a ceramic material, a polymeric material, a plastic material, or a composite material, such as fiber-filled polymeric material.

A hermetically sealed first thermal channel 18 comprises a first evaporator section 20, a first fluid transport section 22, and a first condenser section 24. A phase-change material 12 is contained in the sealed first thermal channel 18. The first evaporator section 20 overlies the semiconductor device 16, such as data processor. The data processor may comprise a microprocessor, a central processing unit, a graphical processing unit, an arithmetic logic unit, a digital signal processor, an application specific integrated circuit, a power switching transistor, an integrated circuit, a programmable logic array, or another semiconductor device 16. The first fluid transport section 22 extends between the first evaporator section 20 and the first condenser section 24. The first evaporator section 20 is spaced apart from the first condenser section 24. The first condenser section 24 is in thermal communication with the heat sink 26.

In one embodiment, a hermetically sealed second thermal channel 118 comprises a second evaporator section 120, a second fluid transport section 122, and a second condenser section 124. A phase-change material 12 contained in the hermetically sealed second thermal channel 118. The second evaporator section 120 overlies the semiconductor device 16. The second fluid transport section 122 extends between the second evaporator section 120 and the second condenser section 124. The second evaporator section 120 is spaced apart from the second condenser section 124. The second condenser section 124 is in thermal communication with the heat sink 26.

A phase-change material 12 may comprise any of the following materials: purified water, methanol, ethanol, ammonia, acetone, propane, toluene; liquid metals that become liquid at elevated temperatures, such as gallium, sodium or lithium; any suitable refrigerant, or other heat-transfer materials, where such heat-transfer materials can be selected to meet environmental regulations and/or sustainability objectives. In one configuration the refrigerant or phase-change material 12 may comprise any commercially available refrigerant, such as R-22 or R-235 and variants thereof.

Figure 5:
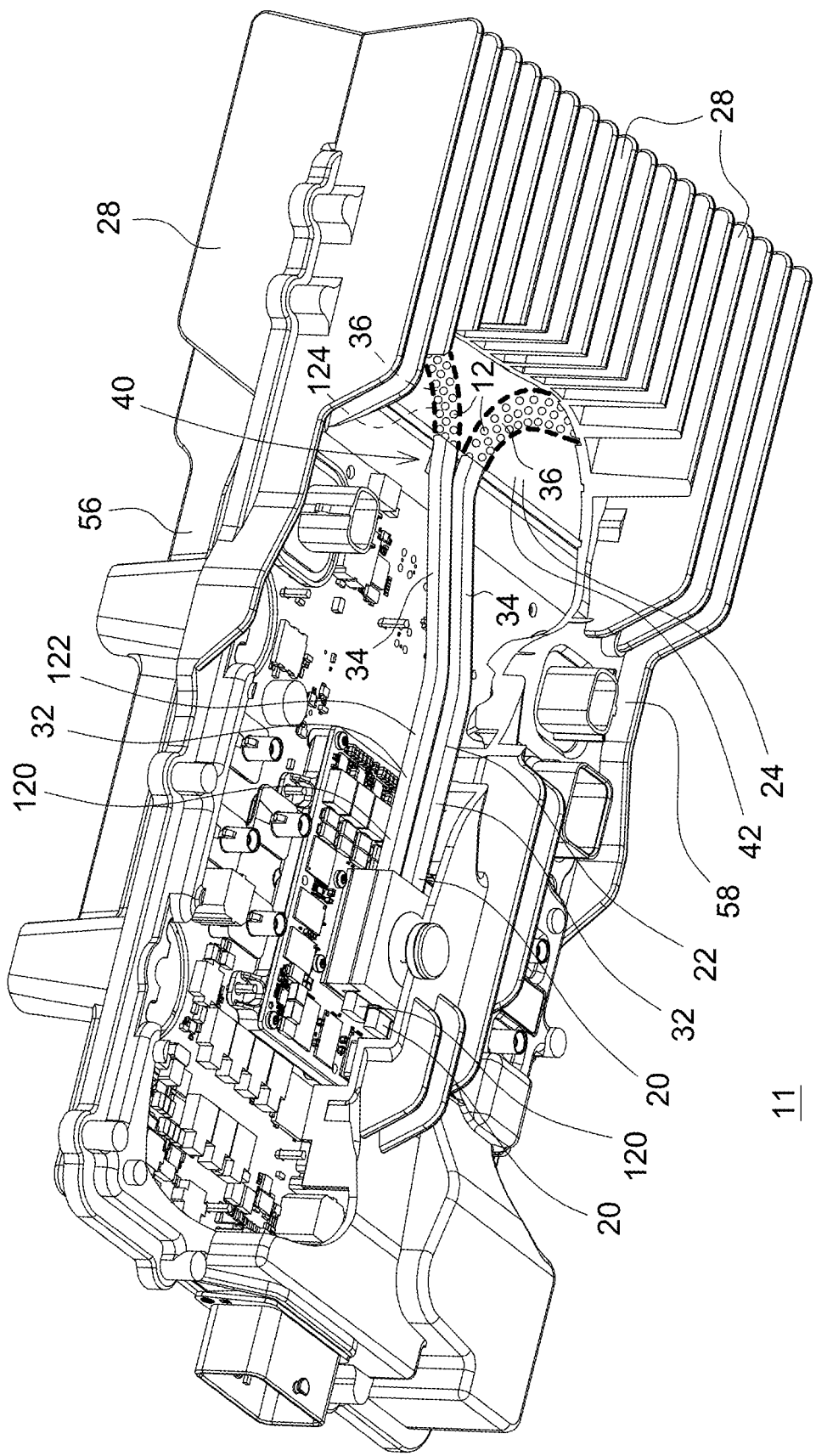
FIG. 5 is a bottom perspective view of the electronic enclosure of FIG. 1 with the housing cut away to better reveal an interior of the electronic enclosure.
Figure 6:
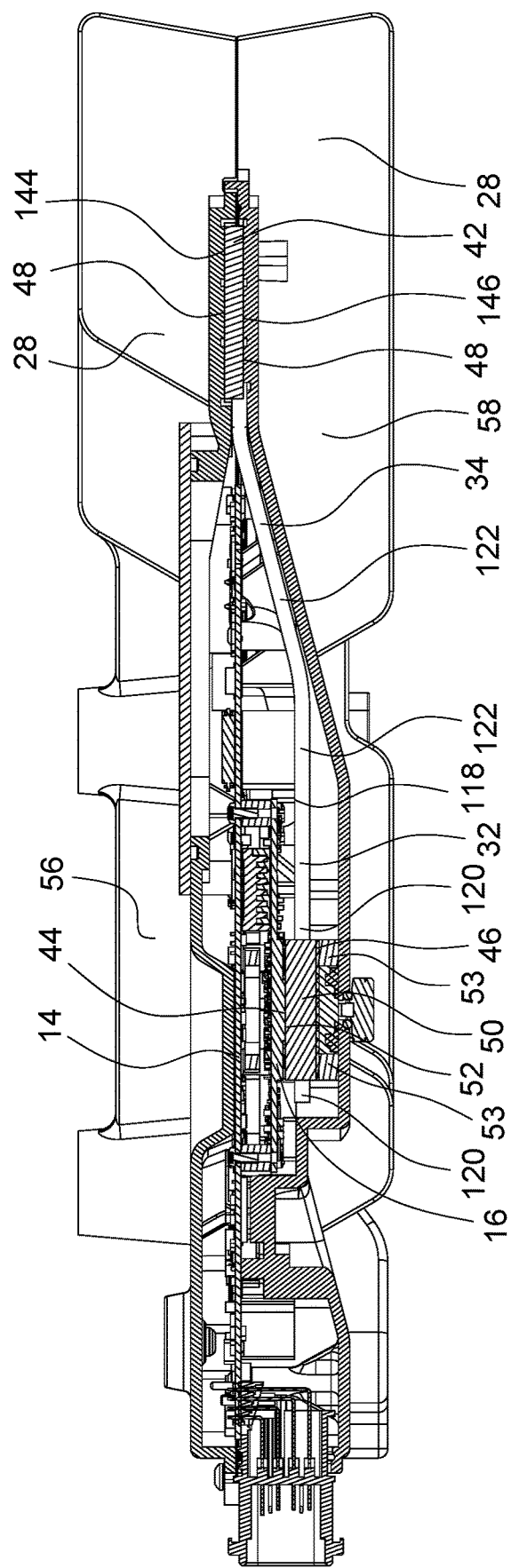
FIG. 6 is a cross-sectional view of the electronic enclosure of FIG. 1 taken along reference lines 6-6 of FIG. 1.

In one configuration, the first evaporator section 20 and the second evaporator section 120 follow generally linear paths and are generally parallel to each other. Further, the first fluid transport section 22 and the second fluid transport section 122 are generally parallel to each other. As illustrated in FIG. 5 and FIG. 6, the first fluid transport section 22 and the second fluid transport section 122 having a wicking section 32 that is generally coplanar in height with respect to the first evaporator section 20 and the second evaporator section 120, respectively. In one embodiment, the wicking section 32 may comprise a group of capillaries or a parallel set of channels within at least a cross-sectional portion of an entire cross section of the first fluid transport section 22 and the second fluid transport section 122. For example, each capillary within the wicking section 32 has a capillary cross-sectional area (e.g., or capillary diameter) that is less than a wicking cross-sectional area (e.g., or wicking diameter).

Figure 3:
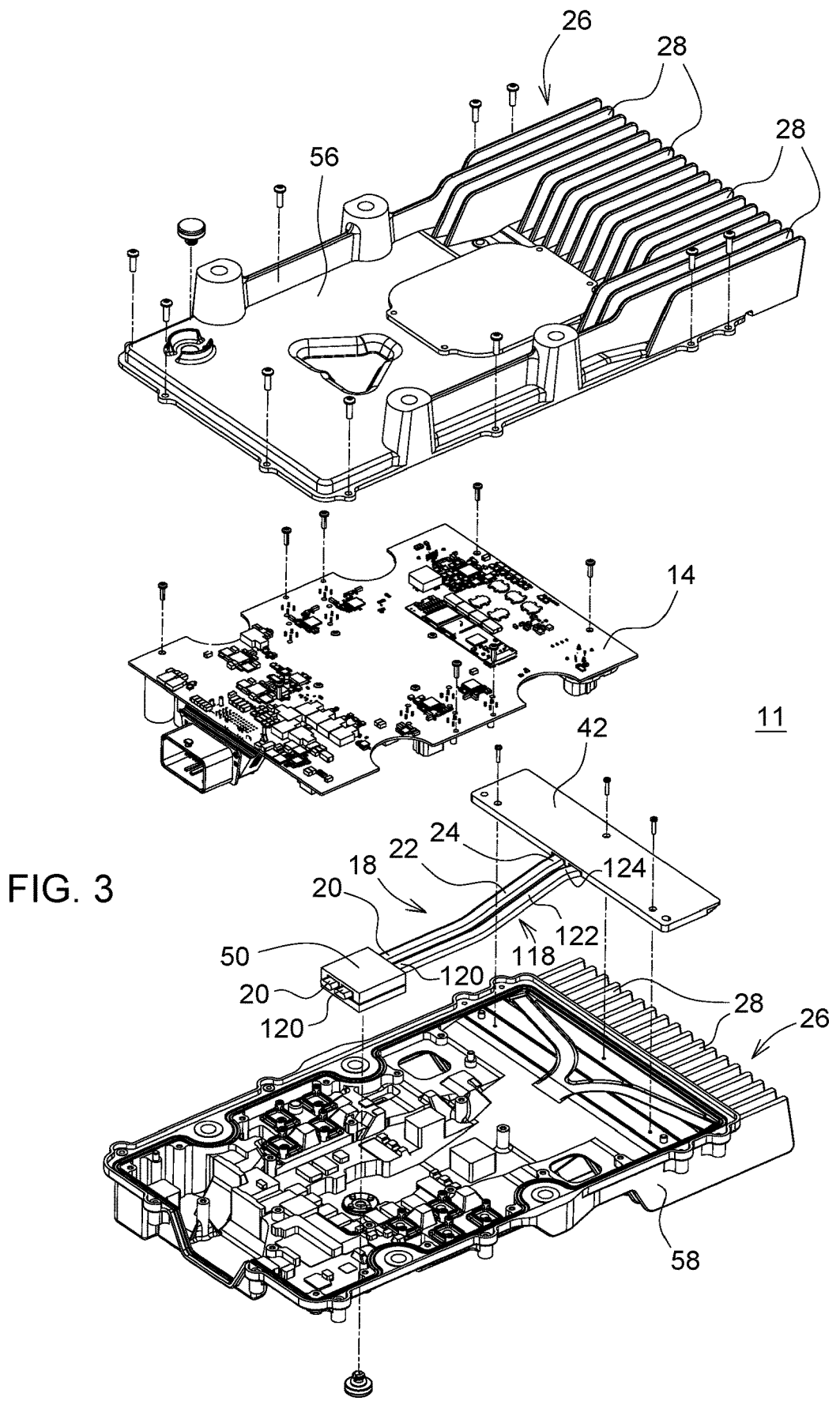
FIG. 3 is an exploded top perspective view of the electronic enclosure of FIG. 1.
Figure 4:
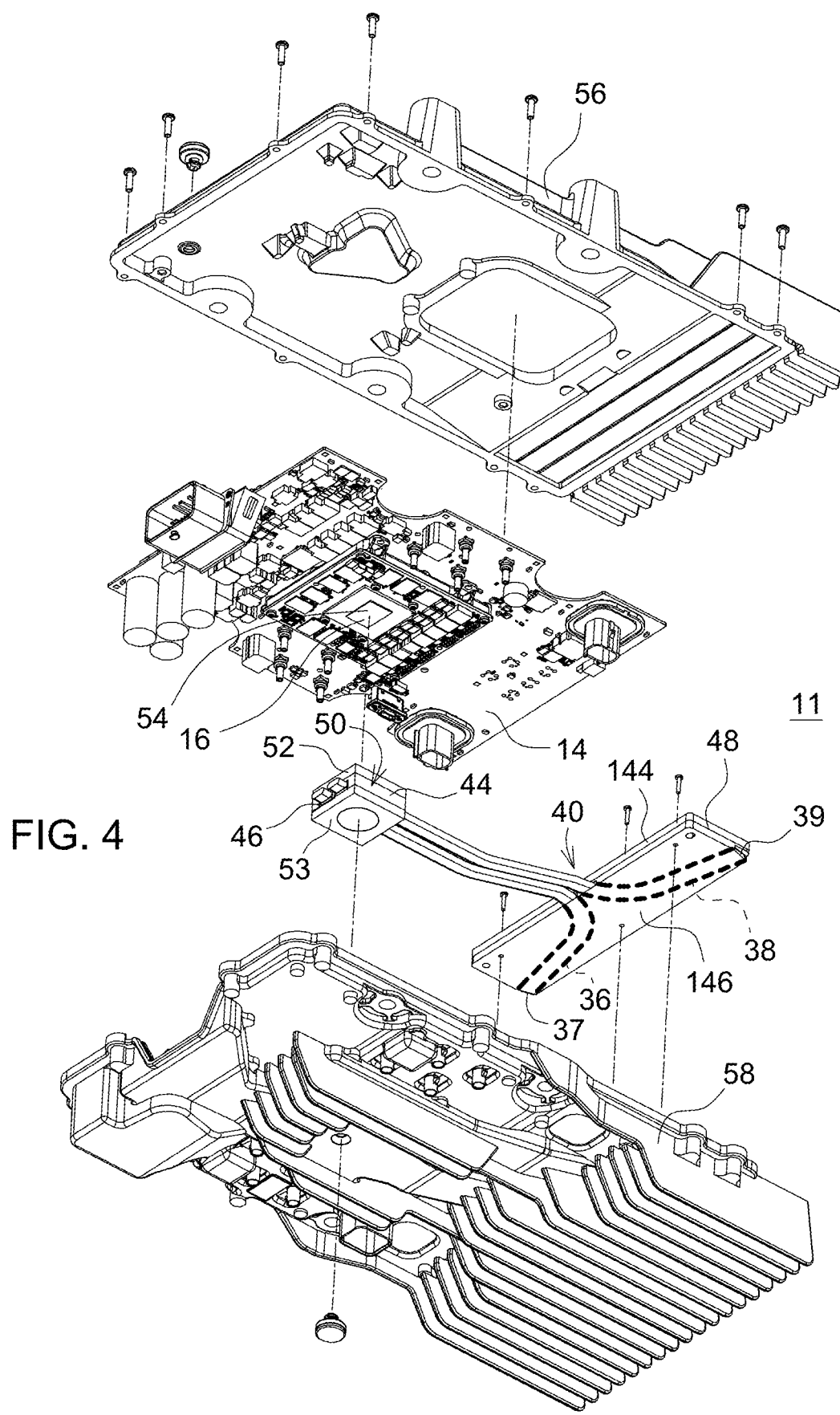
FIG. 4 is an exploded bottom perspective view of the electronic enclosure of FIG. 1, where the first condenser section and the second condenser section are shown in phantom.

As further shown in FIG. 5 and FIG. 6, the first fluid transport section 22 and the second fluid transport section 122 generally follow a sloped path 34 of increasing height away from the first evaporator section 20 and the second evaporator section 120, respectively. As illustrated in FIG. 3 and FIG. 4, the first condenser section 24 and the second condenser section 124 branch outward in opposite directions from the first fluid transport section 22 and the second fluid transport section 122 that track a central longitudinal axis 30 of the electronic assembly 11. For example, the first condenser section 24 has a first branch 36 and the second condenser section 124 has a second branch 38 with terminating ends (37, 39) that are spatially separated by a greater transverse distance that the first condenser section 24 and the second condenser section 124 at a neck region 40 (e.g., first neck region 40 and second neck region 40) prior to the first branch 36 and the second branch 38.

During operation of the semiconductor device 16, the semiconductor device 16 generates thermal energy that is conducted away from the semiconductor device 16 at the lower thermal interface 50, directly or via the thermal interface material 52, via the thermal pad 53, or both. The thermal interface material 52 may comprise a dielectric material with low thermal resistance that is lower than a threshold thermal resistance or a thermally conductive grease. The lower thermal interface 50 is in thermal communication with the first evaporator section 20 and the second evaporator section 120. The phase-change material 12 in the first evaporator section 20 and the second evaporator section 120 evaporates and changes from a liquid phase to a gas phase, while absorbing and dissipating the thermal energy (e.g., generated by one or more semiconductor devices 16). From the first evaporator section 20 and the second evaporator section 120, the phase-change material 12 in the vapor or gas phase travels (e.g., upward) via the first fluid transport section 22 and the second fluid transport section 122 into the first condenser section 24 and the second condenser section 124, respectively.

As the gas phase of the phase-change material 12 cools in the first condenser section 24 and the second condenser section 124, the gas phase of the phase-change material 12 condenses to a liquid phase. By gravity or by capillary action (e.g., by surface tension mechanisms associated with the wicking section 32), or by both gravity and capillary action the condensed phase-change material 12 in liquid phase drips, runs or flows along the first fluid transport section 22 and the second fluid transport section 122, respective, toward the first evaporator section 20 and the second evaporator section 120. In one embodiment, the capillary action supports return of the condensed or liquid phase of the phase-change material back to the first evaporator section 20 and the second evaporator section 120, regardless of the orientation of the electronic assembly 11, such as whether, or not, the first evaporator section 20 and the second evaporator section 120 have a lesser evaporator height than a condenser height of the first condenser section 24 and the second condenser section 124. In one embodiment, the sloped path 34 supports the flow (e.g., by gravity and/or by capillary action) and return of condensed phase change material in the liquid phase to the first condenser section 24 and the second condenser section 124 through a wicking section 32 of the first fluid transport section 22 and the second fluid transport section 122.

In a liquid phase in the first evaporator section 20 and in the second evaporator section 120, the phase-change material 12 is available or ready to transition through another phase-change cycle from evaporation to condensation and then returning to evaporation, as an iterative process that absorbs or dissipates the thermal energy (e.g., generated by one or more semiconductor devices 16).

In one embodiment, an upper thermal interface 42 surrounds or encapsulates, partially or entirely, the first condenser section 24 and the second condenser section 124. The upper thermal interface 42 has a first surface 144 and a second surface 46 opposite the first surface 144. At least one of the first surface 144, the second surface 146, or both overlie the heat sink 26. In one configuration, a thermal interface material 48 intervenes between first surface 144 and/or the second surface 46 and the heat sink 26. The thermal interface material 48 may comprise a commercially available thermal interface material such as a dielectric material that has low thermal resistance that is lower than a threshold thermal resistance, or a thermally conductive grease for efficient conductive transfer of thermal energy.

In one embodiment, a lower thermal interface 50 surrounds or encapsulates, partially or entirely, the first evaporator section 20 and the second evaporator section 120. The lower thermal interface 50 has a first surface 44 and a second surface 46 opposite the first surface 44. The first surface 44 overlies the semiconductor device 16. A thermal interface material 52 intervenes between the first surface 44 and the semiconductor device 16.

In one embodiment, the semiconductor device 16 has a generally planar heat plate 54 in contact with the thermal interface material 52. The thermal interface material 52 may comprise a commercially available thermal interface material such as a dielectric material that has low thermal resistance, or a thermally conductive grease for efficient conductive transfer of thermal energy.

A thermally conductive dielectric pad 53 may be positioned on the second surface 46 for compressible contact with an interior portion of the second housing member 58. The heat sink 26 comprises a series of fins 28 in a first housing member 56 and a second housing member 58 that mates with the first housing member 56.

In one embodiment, the semiconductor device 16 comprises a central processing unit or a graphical processing unit.

As illustrated, one embodiment comprises a hermetically sealed thermal channel that comprises a first hermetically sealed thermal channel and a second thermal channel 118 for transferring heat generated by the semiconductor device 16 to the heat sink 26 or to the ambient air or environment around an electronic enclosure. The electronic enclosure or housing may comprise a first housing member 56 that mates with a second housing member 58, where the first housing member 56 and the second housing member 58 may be connected via fasteners, retainers, snap-fit connector, adhesives or otherwise.

The evaporator sections are configured to couple heat directly from the heat-generating semiconductor device 16 (e.g., CPU/GPU). The fluid transport sections are configured to move the heat from the semiconductor device 16 to the condenser sections. In one embodiment, the first condenser section 24 and the second condenser section 124 adjoin or cooperate with the upper thermal interface 42. For example, the upper thermal interface 42 comprises a heat spreader or heat spreading plate for coupling the heat from the first condenser section 24 and the second condenser section 124 to the heat sink 26 on one or both sides of the housing.

Heat that is released from the vapor in the condenser sections is passed from the fluid transfer sections to the upper thermal interface 42. The upper thermal interface 42 facilitates uniform distribution of heat to the interior surface of heat sink 26, which may have fins 28 on its exterior surface. With high surface area coupling to the upper heat sink 26 to the interior of the heat sink 26, the thermal resistance of heat coupling to the heat sink 26 is kept low. Aiding in low thermal resistance is thermal adhesive (e.g., epoxy) as well as thermal interface material 48 coupling the upper thermal interface 42 to an interior of the heat sink 26, or interior of the first housing member 56 or the second housing member 58. Once heat is within the heat sink 26, it is distributed to the exterior surface of the heat sink 26 via fins 28 or other surface projections where ambient air facilitates drawing heat away from the electronic assembly 11.

In one embodiment, the heat sink 26 comprises fins 28 on both sides of the housing or electronic enclosure. In an alternate embodiment, the heat sink 26 may comprise fins 28 on only one side of the housing or electronic enclosure, such as to accommodate mounting of the electronic assembly 11 or housing in any particular vehicle configuration, with spatial or thermal constraints.

As illustrated in FIG. 1 and FIG. 5, the housing or electronic assembly 11 has a dedicated heat sink 26 or heat sink zone with fins 28 that is spatially and thermally separated; hence, isolated removed from the semiconductor device(s) 16 in the data processing portion of the electronic assembly 11. Accordingly, the electronic assembly 11 is well suited for reducing the temperature of heat-generated semiconductor devices 16 because the heat sink 26 not competing with the thermal load on the rest of the electronic assembly 11.

The hermetically sealed thermal channels unit represents a hydraulically and fluidically sealed system with a phase-change material 12, such as a refrigerant, dedicated to moving heat by a phase change process of the phase-change material 12. The fluid state can refer to the vapor or liquid state of the phase change material.

Heat from the semiconductor device 16 is coupled into the evaporator fluid transfer sections section by a lower thermal interface 50 (e.g., evaporator block). Further, a thermal interface material 52 between the semiconductor device 16 (e.g., GPU/CPU) and the lower thermal interface 50 (e.g., evaporator block) facilitates efficient thermal transfer from the heat generating semiconductor device 16. The heat that is coupled into the lower thermal interface 50 then contributes to a phase change process in the evaporator sections or inside of the fluid transfer sections, or both.

Within the hermetically sealed thermal channels, a wicking section 32 of the fluid transfer sections supports movement of the phase-change material 12 in its liquid phase or form, and a hollow section of the fluid transfer sections supports movement of the vapor in the fluid transfer sections toward the condenser sections. The liquid phase and vapor phase may coexist simultaneously or in parts of the fluid transfer sections.

Phase-change material 12 from the wick structure of the fluid transfer sections is evaporated and pushed into the open section of the hermetically sealed thermal channels from the wick sections within the evaporating section. The vapor travels along the fluid transfer sections in the hollow section until it reaches an area of the fluid transfer sections, or in the condensing sections, that allows for condensation (e.g., temperature low enough to surpass the lower limit if a supper saturated vapor). Condensing in the fluid transfer sections, the condenser sections, or both is mostly contained to the condensing section of the hermetically sealed thermal channels. Once the vapor is within the condensing section, it condenses back into a liquid and re-enters the wick structure. The liquid in the fluid transfer sections is then carried by the wick structure to the evaporator end for the process to begin again; the evaporation and condensing happens continuously within the fluid transfer sections. The liquid is drawing to the evaporator section due to capillary forces and the second law of thermodynamics.

Although this assembly relies on ambient air flow and circulation to remove heat from the heat sink 26 or finned area of the electronic assembly 11, accommodations could be made to drive a forced flow over the surface of the heat sink 26 or finned area by a fan, by an air supply, by a sonic boundary layer interference, by electro static force, or otherwise.

One possible modification to the electronic assembly 11 could include incorporation of a thermo-electric heat pump to help transfer heat into one or more hermetically sealed thermal channels. A thermo-electric heat pump can be placed between the semiconductor device 16 and the evaporator evaporator sections. By then powering the thermo-electric heat pump, heat is pumped from the semiconductor device 16 to the hermetically sealed thermal channels. This enhances the performance of the unit by inducing a larger temperature gradient between the semiconductor device 16 and the heat evaporator sections. The thermo-electric heat pump is optional pending requirements of semiconductor device 16 and environmental conditions.

While the disclosure has been described in detail in the drawings and foregoing description, the description shall be considered as exemplary and illustrative, rather than restrictive of the scope of protection set forth in the claims. Various illustrative embodiments have been shown and described in this document, such that any changes, variants and modifications that come within the spirit of the disclosure will fall within the scope of the disclosure and its associated claims.

The following is claimed:

1. An electronic assembly with phase-change material for thermal performance, the electronic assembly comprising: a substrate; a semiconductor device mounted on the substrate; a lower thermal interface arranged to conduct thermal energy away from the semiconductor device; a sealed first thermal channel comprising a first evaporator section, a first fluid transport section, and a first condenser section; a first phase-change material in the sealed first thermal channel; the first evaporator section overlying the semiconductor device, the lower thermal interface in thermal communication with the first evaporator section, the first evaporator section having a lesser evaporator height than a condenser height of first condenser section within the electronic assembly, where the lower thermal interface partially encapsulates the first evaporator section, and wherein the first evaporator section comprises a tube protruding from opposite sides of the lower thermal interface; the first fluid transport section extending between the first evaporator section and the first condenser section, the first fluid transport section having a wicking section with a group of capillaries, each capillary having a capillary cross-sectional area less than a wicking cross-sectional area of the wicking section, the first evaporator section spaced apart from the first condenser section; a heat sink; the first condenser section in thermal communication with the heat sink, wherein the first phase-change material is contained within the sealed first thermal channel and wherein a condensed phase of the first phase-change material is configured to flow by gravity and by capillary action along the first fluid transport section toward the first evaporator section; and an enclosure for housing the substrate, the semiconductor device, the first evaporator section, the first fluid transport section and the first condenser section within the enclosure.

2. The electronic assembly according to claim 1 further comprising:
a sealed second thermal channel comprising a second evaporator section, a second fluid transport section, and a second condenser section; a second phase-change material in the sealed second thermal channel;
the second evaporator section overlying the semiconductor device, the second evaporator section having a lesser evaporator height than a condenser height of second condenser section within the electronic assembly;
the second fluid transport section extending between the second evaporator section and the second condenser section, the second fluid transport section having a wicking section with a group of capillaries, each capillary having a capillary cross-sectional area less than a wicking cross-sectional area of the wicking section, the second evaporator section spaced apart from the second condenser section;
the second condenser section in thermal communication with the heat sink, wherein the second phase-change material is contained within the sealed second thermal channel and wherein a condensed form of the second phase-change material are configured to flow by gravity and by capillary action along the second fluid transport section toward the second evaporator section.

3. The electronic assembly according to claim 2 wherein the first evaporator section and the second evaporator section follow generally linear paths and are generally parallel to each other.

4. The electronic assembly according to claim 2 wherein the first fluid transport section and the second fluid transport section are generally parallel to each other.

5. The electronic assembly according to claim 4 wherein the first fluid transport section and the second fluid transport section comprise the wicking sections that are generally coplanar in height with respect to the first evaporator section and the second evaporator section, respectively.

6. The electronic assembly according to claim 2 wherein the first fluid transport section and the second fluid transport section generally follow a sloped path of increasing height toward the first condenser section and the second condenser section, respectively.

7. The electronic assembly according to claim 6 wherein the sloped path supports the flow and return of condensed first and second phase-change material in the liquid phase to the first condenser section and the second condenser section through the respective wicking sections of the first fluid transport section and the second fluid transport section.

8. The electronic assembly according to claim 6 wherein the first and second phase-change material in the vapor or gas phase travels upward into the first condenser section and the second condenser section.

9. The electronic assembly according to claim 2 wherein the first condenser section and the second condenser section branch outward in opposite directions from the first fluid transport section and the second fluid transport section that track a central longitudinal axis of the electronic assembly.

10. The electronic assembly according to claim 2 further comprising:
an upper thermal interface that surrounds or encapsulates, partially or entirely, the first condenser section and the second condenser section, the upper thermal interface having a first surface and a second surface opposite the first surface, at least one of the first surface or the second surface overlying the heat sink;
a first thermal interface material intervening between first surface or the second surface and the heat sink.

11. The electronic assembly according to claim 10 wherein the semiconductor device has a generally planar heat plate in contact with the first thermal interface material.

12. The electronic assembly according to claim 2 further comprising:
the lower thermal interface surrounding or encapsulating, partially or entirely, the first evaporator section and the second evaporator section, the lower thermal interface having a first surface and a second surface opposite the first surface, the first surface overlying the semiconductor device;
a second thermal interface material intervening between the first surface and the semiconductor device.

13. The electronic assembly according to claim 2 wherein the first condenser section has a curved first branch with a respective terminating end and wherein the second condenser section has a curved second branch with respective terminating end; the respective terminating ends being spatially separated by a greater transverse distance than the first condenser section and the second condenser section at their respective neck regions prior to the first branch and the second branch.

14. The electronic assembly according to claim 13 wherein the respective neck regions comprise a first neck region and a second neck region.

15. The electronic assembly according to claim 2 wherein the first thermal channel and the second thermal channels comprise hermetically sealed thermal channels.

16. The electronic assembly according to claim 2 wherein the first fluid transport section comprises a first section with a linearly sloped path of increasing height toward the first condenser section, and wherein the second fluid transport section comprises a second section with a linearly sloped path of increasing height toward the second condenser section.

17. The electronic assembly according to claim 1 wherein the heat sink comprises a series of fins on a first housing member and a second housing member that mates with the first housing member.

18. The electronic assembly according to claim 1 wherein the capillary action supports return of the condensed phase or liquid phase of the first phase-change material back to the first evaporator section, regardless of an orientation of the electronic assembly and whether the lesser evaporator height is present with the associated orientation.

19. The electronic assembly according to claim 1 wherein the first fluid transport section is parallel to and coplanar with a second fluid transport section.

20. The electronic assembly according to claim 1 wherein the enclosure has a portion or recess that conforms to the linearly sloped paths.

* * * * *